US012486592B2

(12) United States Patent
Yang et al.

(10) Patent No.: US 12,486,592 B2
(45) Date of Patent: Dec. 2, 2025

(54) HEATER IN HOT-ZONE OF SINGLE CRYSTAL PULLING APPARATUS AND SINGLE CRYSTAL PULLING APPARATUS

(71) Applicants: Xi'an ESWIN Material Technology Co., Ltd., Xi'an (CN); Xi'an ESWIN Silicon Wafer Technology Co., Ltd., Xi'an (CN)

(72) Inventors: Wenwu Yang, Xi'an (CN); Bokcheol Sim, Xi'an (CN)

(73) Assignees: XI'AN ESWIN MATERIAL TECHNOLOGY CO., LTD., Xi'an (CN); XI'AN ESWIN SILICON WAFER TECHNOLOGY CO., LTD., Xi'an (CN)

( * ) Notice: Subject to any disclaimer, the term of this patent is extended or adjusted under 35 U.S.C. 154(b) by 69 days.

(21) Appl. No.: 17/914,720

(22) PCT Filed: Sep. 24, 2021

(86) PCT No.: PCT/CN2021/120451
§ 371 (c)(1),
(2) Date: Sep. 26, 2022

(87) PCT Pub. No.: WO2022/068700
PCT Pub. Date: Apr. 7, 2022

(65) Prior Publication Data
US 2023/0349066 A1 Nov. 2, 2023

(30) Foreign Application Priority Data
Sep. 29, 2020 (CN) ......................... 202011053337.0

(51) Int. Cl.
*C30B 35/00* (2006.01)
*C30B 15/14* (2006.01)
*C30B 15/20* (2006.01)

(52) U.S. Cl.
CPC .............. *C30B 15/14* (2013.01); *C30B 15/20* (2013.01); *C30B 35/00* (2013.01)

(58) Field of Classification Search
CPC ......... C30B 15/00; C30B 15/14; C30B 15/20; C30B 29/00; C30B 29/02; C30B 29/06; C30B 35/00; C30B 35/007
(Continued)

(56) References Cited

U.S. PATENT DOCUMENTS 4,915,723 A 4/1990 Kaneko et al.
5,162,072 A 11/1992 Azad
(Continued)

FOREIGN PATENT DOCUMENTS

CN 85101043 A 1/1987
CN 103556222 A 2/2014
(Continued)

OTHER PUBLICATIONS

Written Opinion and International Search Report of the International Search Authority corresponding to International Application No. PCT/CN2021/120451, dated Dec. 8, 2021. (11 pages).
(Continued)

*Primary Examiner* — Kenneth A Bratland, Jr.
(74) *Attorney, Agent, or Firm* — Maginot, Moore & Beck LLP

(57) ABSTRACT

The present disclosure discloses a heater in a Hot-Zone of a single crystal pulling apparatus and a single crystal pulling apparatus. The heater in the Hot-Zone of the single crystal pulling apparatus includes a side-main heater and an auxiliary heater. Each of the side-main heater and the auxiliary heater is a cylindrical structure with openings at two ends thereof. Each of the side-main heater and the auxiliary heater includes a top open end and a bottom open end. The auxiliary heater is sleeved around the side-main heater, and
(Continued)

the top open end of the auxiliary heater extends out of the top open end of the side-main heater.

16 Claims, 7 Drawing Sheets

(58) Field of Classification Search
USPC ......... 117/13, 200, 204, 206, 208, 217, 928, 117/931–932
See application file for complete search history.

(56) References Cited

U.S. PATENT DOCUMENTS

| | | | | |
|---|---|---|---|---|
| 6,117,230 | A | 9/2000 | Ammon et al. | |
| 6,285,011 | B1 * | 9/2001 | Cherko | C30B 15/14 219/424 |
| 2005/0160973 | A1 | 7/2005 | Wiseman | |

FOREIGN PATENT DOCUMENTS

| | | | | |
|---|---|---|---|---|
| CN | 106521624 | A | | 3/2017 |
| CN | 208063501 | U | | 11/2018 |
| CN | 110172730 | A | | 8/2019 |
| CN | 112267147 | A | | 1/2021 |
| DE | 68913237 | T2 | | 9/1994 |
| JP | 61-106487 | A | * | 5/1986 |
| JP | S61106487 | A | | 5/1986 |
| JP | 61-132598 | A | * | 6/1986 |
| JP | S61132598 | A | | 6/1986 |
| JP | 63-103889 | A | * | 5/1988 |
| JP | S63103889 | A | | 5/1988 |
| JP | 08-081298 | A | * | 3/1996 |
| JP | H0881298 | A | | 3/1996 |
| JP | 2016204231 | A | | 12/2016 |
| JP | 2018048054 | A | | 3/2018 |

OTHER PUBLICATIONS

English Translation of Written Opinion and International Search Report of the International Search Authority corresponding to International Application No. PCT/CN2021/120451, dated Dec. 8, 2021. (5 pages).
Machine English Translation of JP2016204231A. (16 Pages).
Machine English Translation of CN85101043A. (11 Pages).
Machine English Translation of CN106521624A. (15 Pages).
Machine English Translation of CN112267147A. (22 Pages).
Machine English Translation of CN208063501U. (8 Pages).
Chinese Office Action corresponding to Chinese Patent Application No. 202011053337.0 dated Aug. 6, 2021. (9 Pages).
Machine English Translation of Chinese Office Action corresponding to Chinese Patent Application No. 202011053337.0 dated Aug. 6, 2021. (7 Pages).
Machine English Translation of CN103556222A. (15 Pages).
Machine English Translation of CN110172730A. (21 Pages).
Japanese Office Action corresponding to Japanese Application No. 10-2022-7009024, dated Nov. 30, 2023. (5 Pages).
English Translation of Japanese Office Action corresponding to Japanese Application No. 10-2022-7009024, dated Nov. 30, 2023. (5 Pages).
English Translation of JPH0881298A. (16 Pages).
English Translation of JPS61106487A. (4 Pages).
English Translation of JPS63103889A. (4 Pages).
German Office Action corresponding to German Application No. 11 2021 005 133.4, dated May 10, 2024. (5 Pages).
English Translation of German Office Action corresponding to German Application No. 11 2021 005 133.4, dated May 10, 2024. (6 Pages).
English Translation of JPS61132598A. (4 Pages).
English Translation of JP2018048054A. (6 Pages).

* cited by examiner

HEATER IN HOT-ZONE OF SINGLE CRYSTAL PULLING APPARATUS AND SINGLE CRYSTAL PULLING APPARATUS

CROSS-REFERENCE TO RELATED APPLICATION

This application is the U.S. national phase of PCT Application PCT/CN2021/120451 filed on Sep. 24, 2021, which claims the priority of Chinese Application No. 202011053337.0, filed on Sep. 29, 2020, the disclosures of which are incorporated in their entirety by reference herein.

TECHNICAL FIELD

The present disclosure relates to the field of semiconductor wafer technologies, and in particular to a heater in a Hot-Zone of a single crystal pulling apparatus and a single crystal pulling apparatus.

BACKGROUND

When pulling single crystal silicon ingot, it is necessary to use a single crystal pulling apparatus to melt polycrystalline silicon raw material in a specialized quartz crucible, and then use a seed to lead a growth of a single crystal silicon ingot. With continuous improvement of quality of semiconductor silicon wasfers, there are more stringent control requirements for crystal defects of crystal ingots due to the crystal pulling process. Internal structures of the single crystal pulling apparatus constitute the Hot-Zone. Structures and performance of the Hot-Zone directly affect the quality of the crystal ingot, and thus the design of the Hot-Zone is very important.

For one single crystal pulling apparatus, the design of heaters is one of kernels of design of the Hot-Zone. The heaters are divided into a main heater and a bottom heater. The main heater is also referred as a side-main heater, which is arranged around the outside of the crucible, and the bottom heater is arranged at a bottom of the crucible. The side-main heater is responsible for main heat output of the single crystal pulling apparatus, and plays an important role in a melting stage of polysilicon material and a later body growth stage of crystal ingots. Shape and size of a heating area of the side-main heater directly affect a temperature field of the single crystal pulling apparatus, which in turn affects the quality of the crystal ingot.

However, the heating area of the side-main heater in the Hot-Zone in the related art is very small, and then the heating is uneven. When the temperature field is kept constant, the power consumption will increase, which is not conducive to cost saving. Further, the side-main heater is usually a resistance heater, which heats up slowly, leads to need a long time to reach the set temperature, and takes a long time on melting stage of polysilicon material, thereby greatly increasing the time cost. Meanwhile, it is difficult for one resistance heater to ensure stability of the temperature field required by three phases including solid, liquid and gas of a molten silicon melt surface. The instability of the temperature field will lead to formation of local thermal shock, which is not conducive to defect-free growth of the crystal ingot.

SUMMARY

In order to solve the foregoing technical problems, embodiments of the present disclosure provide a heater in a Hot-Zone of a single crystal pulling apparatus and a single crystal pulling apparatus, which have characteristics such as good heating effect, fast heating up, stable temperature in a hot-zone, which are conducive to defect-free growth of crystal ingots during a crystal growth process, thereby improving the yield of the crystal ingots.

The technical solutions provided in the embodiments of the present disclosure are as follows.

A heater in a Hot-Zone of a single crystal pulling apparatus, includes: a side-main heater; and an auxiliary heater; wherein each of the side-main heater and the auxiliary heater is a cylindrical structure with openings at two ends thereof; each of the side-main heater and the auxiliary heater includes a top open end and a bottom open end; the auxiliary heater is sleeved around the side-main heater, and the top open end of the auxiliary heater extends out of the top open end of the side-main heater.

Optionally, the auxiliary heater includes:

- a protective casing; wherein the protective casing surrounds the side-main heater; and
- an electromagnetic induction coil; wherein the electromagnetic induction coil is accommodated in the protective casing.

Optionally, the protective casing includes an inner casing and an outer casing that are fastened to each other; each of the inner casing and the outer casing is cylindrical; the inner casing covers and surrounds an outer peripheral side of the side-main heater; the outer casing is sleeved around the inner casing with a chamber defined between the outer casing and the inner casing; the inner casing includes a first inner side wall that cooperates with the outer casing to define the chamber; the electromagnetic induction coil is accommodated in the chamber; the electromagnetic induction coil is spirally wound around the first inner side wall from a top open end of the inner casing to a bottom open end of the inner casing; and two ends of the electromagnetic induction coil extend out of the protective casing, respectively.

Optionally, a stepped first edge is provided at the top open end of the inner casing; a stepped second edge is provided at an edge of a top open end of the outer casing; stepped structures of the first edge and the second edge overlap each other; a stepped third edge is provided at an edge of the bottom open end of the inner casing and a stepped fourth edge is provided at an edge of a bottom open end of the outer casing; and stepped structures of the third edge and the fourth edge overlap each other.

Optionally, the electromagnetic induction coil includes a plurality of spiral rings; a plurality of first supporters is provided on the first inner side wall of the inner casing, and one of the plurality of first supporters is arranged between two adjacent spiral rings.

Optionally, the side-main heater includes:

- a heater body; wherein the heater body is a first cylindrical structure; and
- an insulating protective cover; wherein the insulating protective cover is a cylindrical cover, covers and surrounds an outside of the heater body; and the insulating protective cover at least covers a top open end of the heater body, a bottom open end of the heater body, and an outer peripheral side between the top open end and the bottom open end of the heater body.

Optionally, the heater body includes a plurality of U-shaped heating column units; the plurality of U-shaped heating column units are connected in sequence to form the first cylindrical structure; among two adjacent ones of the plurality of U-shaped heating column units, an opening of one U-shaped heating column unit is oriented towards a top open end of the first cylindrical structure, and an opening of the other U-shaped heating column unit is oriented towards a bottom open end of the first cylindrical structure, thereby enabling an outline of the heater body to be a serpentine curve structure.

Optionally, each of the plurality of U-shaped heating column units includes:

two vertical straight heating columns which are parallel to each other, wherein an extension direction of the vertical straight heating columns is parallel to an axial direction of the first cylindrical structure; and, an arc-shaped or linear transverse heating column connected between the two vertical straight heating columns;

wherein there is a gap, in a circumferential direction of the first cylindrical structure, between the two vertical straight heating columns; a width of the gap in the circumferential direction of the first cylindrical structure is greater than or equal to a width of the vertical straight heating column in the circumferential direction of the first cylindrical structure.

Optionally, the width of the vertical straight heating column in the circumferential direction of the first cylindrical structure is 15-20 mm; a cross-sectional area of the vertical straight heating column is 150-200 $mm^2$; and a length of the vertical straight heating column from the top open end to the bottom open end of the first cylindrical structure is 320~350 mm.

Optionally, a plurality of second supporters for supporting the heater body is provided on an inner side wall of the insulating protective cover; and, at least one of the plurality of second supporters is disposed in the gap between the two vertical straight heating columns of each of the plurality of U-shaped heating column units.

Optionally, the plurality of second supporters include a plurality of first support columns and a plurality of second support columns arranged alternately; the first support column is arranged in the gap between the two vertical straight heating columns of the U-shaped heating column unit whose opening is oriented towards the top open end of the heater body; and the second support column is arranged in the gap between the two vertical straight heating columns of the U-shaped heating column unit whose opening is oriented towards the bottom open end of the heater body.

Optionally, the insulating protective cover includes a first cover body and a second cover body;

the first cover body includes: an annular top shielding plate, wherein the top shielding plate shields the top open end of the heater body; and, a side shielding plate, wherein the side shielding plate surrounds the outer peripheral side of the heater body and fixedly connected with the top shielding plate; and the plurality of first support columns are evenly distributed along a circumferential direction of the top shielding plate, and are fixed on an inner side wall of the side shielding plate;

the second cover body includes: an annular bottom shielding plate; wherein the bottom shielding plate shields the bottom open end of the heater body, the plurality of second support columns are evenly distributed along a circumferential direction of the bottom shielding plate, and the plurality of second support columns are fixed on the bottom shielding plate;

wherein the plurality of second support columns are inserted into the side shielding plate to fasten the first cover body to the second cover body.

Optionally, the insulating protective cover includes a first cover body and a second cover body;

the first cover body includes: an annular bottom shielding plate, wherein the bottom shielding plate shields the bottom open end of the heater body; and, a side shielding plate, wherein the side shielding plate surrounds the outer peripheral side of the heater body and fixedly connected with the bottom shielding plate; and the plurality of second support columns are evenly distributed along a circumferential direction of the bottom shielding plate, and are fixed on an inner side wall of the side shielding plate;

the second cover body includes: an annular top shielding plate; wherein the top shielding plate shields the top open end of the heater body, the plurality of first support columns are evenly distributed along a circumferential direction of the top shielding plate, and the plurality of first support columns are fixed on the top shielding plate;

wherein the plurality of first support columns are inserted into the side shielding plate to fasten the first cover body to the second cover body.

Optionally, the heater body is further connected with at least a first electrode connector and a second electrode connector; the first electrode connector and the second electrode connector are located at opposite sides of the heater body, respectively; the insulating protective cover is provided with at least a first opening and a second opening; the first electrode connector extends through the first opening, and the second electrode connector extends through the second opening.

A single crystal pulling apparatus includes the foregoing heater in a Hot-Zone of the single crystal pulling apparatus.

The beneficial effects brought by the embodiments of the present disclosure are as follows.

The heater in the Hot-Zone of the single crystal pulling apparatus and the single crystal pulling apparatus provided in the embodiment of the present disclosure includes the side-main heater and the auxiliary heater. The auxiliary heater can play the following functions: melting raw material with a rapid heating, performing temperature compensation for thermal field generated by the side-main heater and maintaining the temperature field of the area in which solid, liquid and gas are included near the surface of silicon melt stable by cooperating with the side-main heater during the body growth stage of crystal ingots, which is conducive to defect-free growth of the crystal ingot. Furthermore, the auxiliary heater can provide heating power together with the side-main heater, which prolongs the service life of the heater. In addition, compared with a heater in a Hot-Zone of a single crystal pulling apparatus in the related art, the heater in the Hot-Zone of the single crystal pulling apparatus and the single crystal pulling apparatus provided in the embodiments of the present disclosure are configured to provide a larger heating area and a higher energy conversion rate, and are configured to be more energy-saving and cost-saving in case of providing the same temperature field as the related art. Further, the side-main heater and the auxiliary heater are configured to cooperate with each other so that they are applicable in a more expended scope and provide the accurate adjustment.

DETAILED DESCRIPTION

Figure 1:
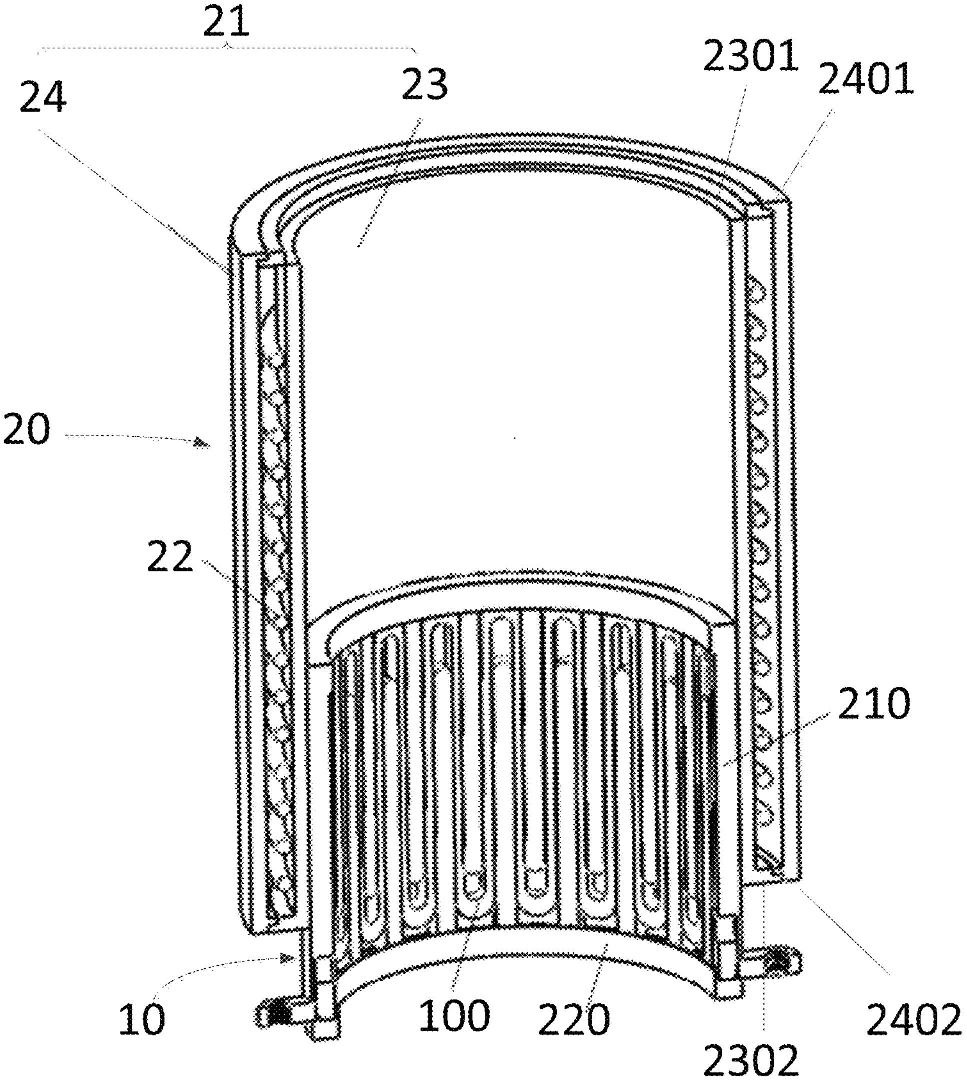
FIG. 1 shows a schematic cross-sectional view of an overall structure of a heater in a Hot-Zone of a single crystal pulling apparatus according to an embodiment of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as “first” and “second” used in the present disclosure are merely used to differentiate different components rather than to represent any order, number or importance. Similarly, such words as “one” or “one of” are merely used to represent the existence of at least one member, rather than to limit the number thereof. Such words as “include” or “including” mean that an element or thing appearing before the word encompass elements or things recited after the word and their equivalents, but do not exclude other elements or things. Such words as “connect” or “connected to” may include electrical connection, direct or indirect, rather than being limited to physical or mechanical connection. Such words as “on/above”, “under/below”, “left” and “right” are merely used to represent relative position relationship, and when an absolute position of an object is changed, the relative position relationship will be changed too.

Before describing in detail a heater in a Hot-Zone of a single crystal pulling apparatus and a single crystal pulling apparatus according to embodiments of the present disclosure, it is necessary to describe the related technology as follows.

A heating area of a side-main heater in a Hot-Zone in the related art is very small, and then the heating is uneven. When a temperature field is kept constant, the power consumption will increase, which is not conducive to cost saving. Further, the side-main heater is usually a resistance heater, which heats up slowly, leads to need a long time to reach the set temperature, and takes a long time on melting stage of polysilicon material, thereby greatly increasing the time cost. Meanwhile, it is difficult for one resistance heater to ensure stability of the temperature field required by three phases including solid, liquid and gas of a molten silicon melt surface. The instability of the temperature field will lead to formation of local thermal shock, which is not conducive to defect-free growth of the crystal ingot.

In view of the foregoing problems, embodiments of the present disclosure provide a heater in a Hot-Zone of a single crystal pulling apparatus and a single crystal pulling apparatus, which have characteristics such as good heating effect, fast heating up, stable temperature in a hot-zone, which are conducive to defect-free growth of crystal ingots during a crystal growth process, thereby improving the yield of the crystal ingots.

As shown in FIG. 1, a heater in a Hot-Zone of a single crystal pulling apparatus according to an embodiment of the present disclosure includes: a side-main heater 10 and an auxiliary heater 20. Each of the side-main heater 10 and the auxiliary heater 20 is a cylindrical structure with openings at two ends thereof. Each of the side-main heater 10 and the auxiliary heater 20 includes a top open end and a bottom open end. The auxiliary heater 20 is sleeved around the side-main heater 10, and the top open end of the auxiliary heater 20 extends out of the top open end of the side-main heater 10.

The heater in the Hot-Zone of the single crystal pulling apparatus provided in the embodiment of the present disclosure includes the side-main heater 10 and the auxiliary heater 20. The auxiliary heater 20 can play the following functions: melting raw material with a rapid heating, performing temperature compensation for thermal field generated by the side-main heater 10 and maintaining the temperature field of the area in which solid, liquid and gas are included near the surface of silicon melt stable by cooperating with the side-main heater during the body growth stage of crystal ingots, which is conducive to defect-free growth of the crystal ingot. Furthermore, the auxiliary heater can provide heating power together with the side-main heater, which prolongs the service life of the heater. In addition, compared with a heater in a Hot-Zone of a single crystal pulling apparatus in the related art, the heater in the Hot-Zone of the single crystal pulling apparatus and the single crystal pulling apparatus provided in the embodiments of the present disclosure are configured to provide a larger heating area and a higher energy conversion rate, and are configured to be more energy-saving and cost-saving in case of providing the same temperature field as the related art. Further, the side-main heater and the auxiliary heater are configured to cooperate with each other so that they are applicable in a more expended scope and provide the accurate adjustment.

Figure 2:
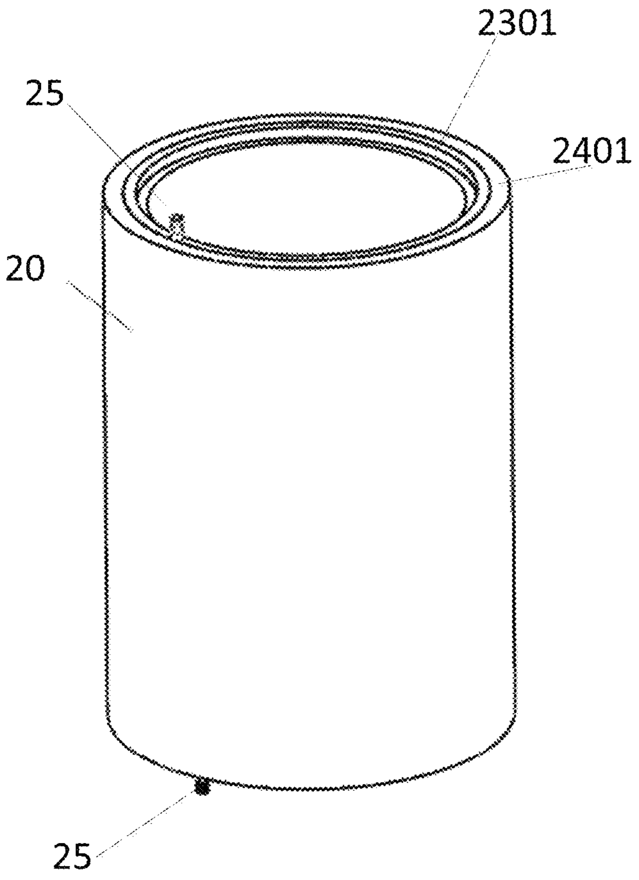
FIG. 2 is a schematic diagram showing an overall appearance of an auxiliary heater in a heater in a Hot-Zone of a single crystal pulling apparatus according to an embodiment of the present disclosure.
Figure 3:
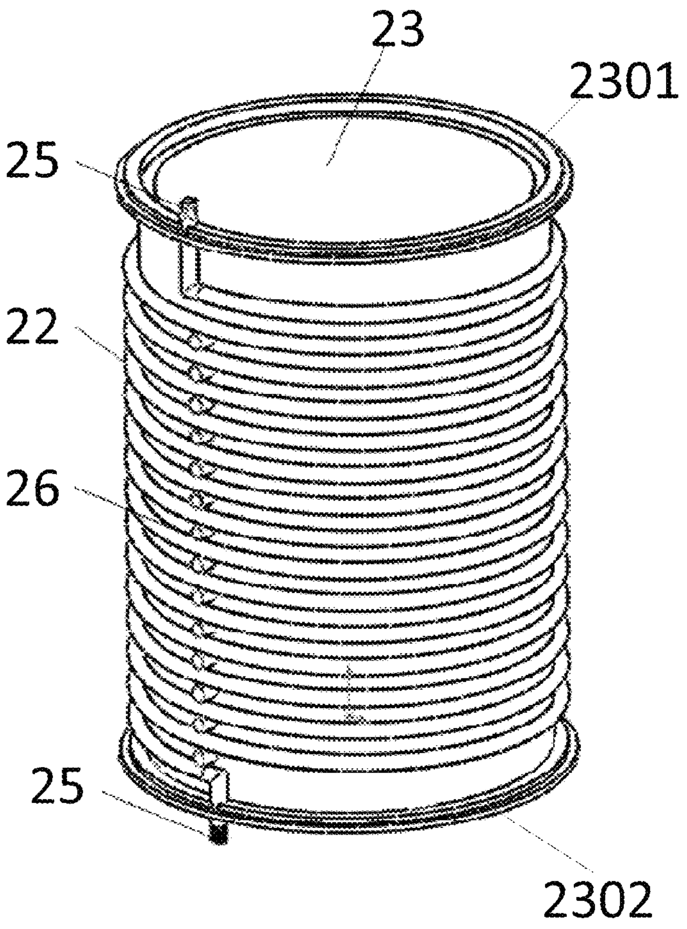
FIG. 3 is a schematic diagram showing an inner casing and an electromagnetic induction coil of an auxiliary heater in a heater in a Hot-Zone of a single crystal pulling apparatus according to an embodiment of the present disclosure.

In some embodiments, as shown in FIG. 1 to FIG. 3, the auxiliary heater 20 includes a protective casing 21 and an electromagnetic induction coil 22. The protective casing 21 surrounds the side-main heater 10. The electromagnetic induction coil is accommodated in the protective casing 21.

In the above embodiment, the auxiliary heater 20 adopts an electromagnetic induction heater, and the side-main heater 10 and the electromagnetic induction auxiliary heater 20 cooperate together to increase the adjustment range and adjustment accuracy of the heater. Compared with resistance heaters, the electromagnetic induction heater, due to its higher adjustment range and adjustment accuracy, can better maintain the temperature field of the area in which solid, liquid and gas are included near the surface of silicon melt stable.

Of course, it can be understood that, in practical applications, the auxiliary heater 20 may also adopt a resistance heater.

In addition, in some embodiments, as shown in FIG. 1 to FIG. 3, the protective casing 21 includes an inner casing 23 and an outer casing 24 that are fastened to each other. Each of the inner casing 23 and the outer casing 24 is cylindrical. The inner casing 23 is covered and surrounds an outer peripheral side of the side-main heater 10. The outer casing 24 is sleeved around the inner casing 23 with a chamber defined between the outer casing 24 and the inner casing 23. The inner casing 23 includes a first inner side wall that cooperates with the outer casing 24 to define the chamber. The electromagnetic induction coil 22 is accommodated in the chamber. The electromagnetic induction coil 22 is spirally wound around the first inner side wall from the top open end of the inner casing 23 to the bottom open end of the inner casing 23. Two ends of the electromagnetic induction coil 22 are power supply terminals 25, respectively. The power supply terminals 25 extend out of two ends of the protective casing 21, respectively.

In the above embodiment, the two ends of the electromagnetic induction coil 22 are power supply terminals 25, respectively, which extend out of the protective casing 21 and are connected to an AC power source. According to the principle of electromagnetic induction heating, the electromagnetic induction coil 22 converts the generated induced electric energy into heat energy, and then transfers heat in form of thermal radiation to silicon material in a quartz crucible. The protective casing 21 serves the purpose of protecting the electromagnetic induction coil 22, preventing erosion of the electromagnetic induction coil 22 in the auxiliary heater 20 by an argon flow and deposition of $SiO_2$ on the electromagnetic induction coil 22, thereby improving the service life of the auxiliary heater 20. Meanwhile, the auxiliary heater 20 also has a heat preservation effect, which reduces heat loss, so that more heat can be transferred to the inside of the crucible in the Hot-Zone, thereby improving an energy conversion efficiency of the heater.

In some embodiments, as shown in FIG. 1 to FIG. 3, a stepped first edge 2301 is provided at the top open end of the inner casing 23, and a stepped second edge 2401 is provided at an edge of the top open end of the outer casing 24. Stepped structures of the first edge 2301 and the second edge 2401 overlap each other. A stepped third edge 2302 is provided at an edge of the bottom open end of the inner casing 23 and a stepped fourth edge 2402 is provided at an edge of the bottom open end of the outer casing 24. Stepped structures of the third edge 2302 and the fourth edge 2402 overlap each other.

In the above embodiment, the inner casing 23 and the outer casing 24 are overlapped with each other by the stepped structures provided at the edges of the openings, thereby realizing the mutual fastening between the two. In practical applications, specific structures of the inner casing 23 and the outer casing 24 are not limited to this.

In addition, in some embodiments, as shown in FIG. 1 and FIG. 3, the electromagnetic induction coil 22 includes a plurality of spiral rings. A plurality of first supporters 26 is provided on the first inner side wall of the inner casing 23, and one first supporters 26 is arranged between two adjacent spiral rings.

In the foregoing solution, the electromagnetic induction coil 22 is spirally distributed inside the protective casing 21, and each spiral ring can be supported by the first supporter 26, thereby improving comprehensive mechanical properties of the electromagnetic induction coil 22.

Optionally, the first supporter 26 may be a support column, but the specific structure of the first supporter is not limited thereto.

In addition, a main heater in a Hot-Zone of a single crystal pulling apparatus in the related art is arranged at an outer peripheral side of a crucible, and is directly exposed to argon flows without a protective device. During the crystal pulling process, the argon flows will continuously erode an upper surface and an outer surface of the heater, which greatly reduces the service life of the main heater; and $SiO_2$ (silicon dioxide) deposition occurs in corresponding positions, and the removal of $SiO_2$ will also reduce the service life of the heater.

Figure 4:
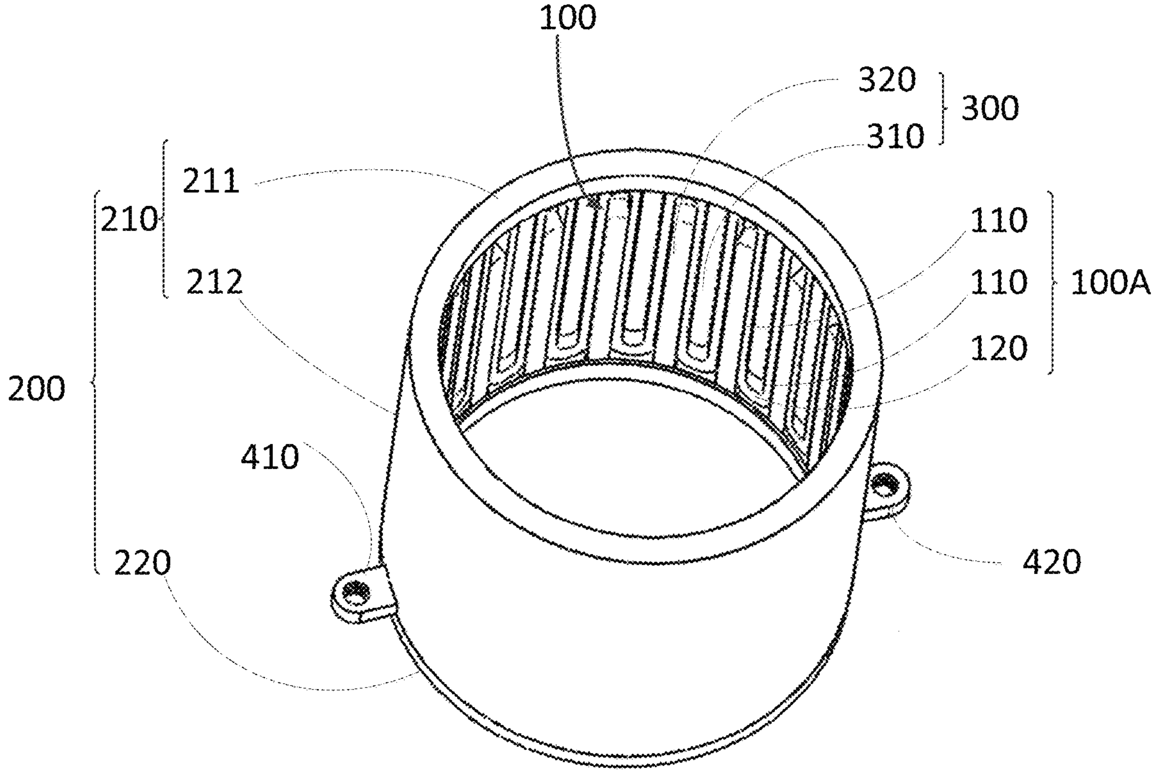
FIG. 4 is a schematic diagram showing an overall structure of a side-main heater in a heater in a Hot-Zone of a single crystal pulling apparatus according to an embodiment of the present disclosure.

In order to solve the foregoing technical problems, in some embodiments of the present disclosure, as shown in FIG. 4, the main heater 10 includes: a heater body 100 and an insulating protective cover 200. The heater body 100 is a first cylindrical structure arranged around a crucible in the Hot-Zone of the single crystal pulling apparatus, and includes a top open end, a bottom open end, and an outer peripheral side located between the top open end and the bottom open end. The insulating protective cover 200 is a cylindrical cover, which covers and surrounds an outside of the heater body 100. The insulating protective cover 200 at least covers the top open end of the first cylindrical structure, the bottom open end of the first cylindrical structure, and the outer peripheral side between the top open end and the bottom open end of the first cylindrical structure.

In the single-crystal-furnace Hot-Zone heater provided in the embodiment of the present disclosure, by covering the heater body 100 with the insulating protective cover 200, the insulating protective cover 200 can wrap and cover the top open end, the bottom open end and the outer peripheral side of the heater body 100, thereby preventing erosion of the heater body 100 by the argon flows and deposition of $SiO_2$ on the heater body 100, and then improving the service life of the heater. Meanwhile, the cylindrical insulating protective cover 200 also has a heat preservation effect, which reduces heat loss of the heater body 100, so that more heat can be transferred to the inside of the crucible in the Hot-Zone, thereby improving an energy conversion efficiency of the heater.

In addition, in the related art, a conventional side-main heater 10 in a Hot-Zone of a single crystal pulling apparatus includes a sheet-like cylindrical structure, and the sheet-like cylindrical structure is provided with a plurality of slits to form a plurality of blades. Each blade has a large width. The heating power of the side-main heater 10 is related to a cross-sectional size of the blade. The relationship between the heating power of the side-main heater 10 and a cross-sectional area of the blade is as follows:

$$R = \frac{\rho L}{S} \tag{I}$$

$$P = I^2 R \tag{II}$$

Where, P represents a power of the side-main heater 10; I represents a current; R represents resistance of a blade; ρ represents a resistivity of the blade; S represents a cross-sectional area of the blade; and L represents a length of the blade.

From formulas (I) and (II), it can be obtained:

$$P = I^2 \frac{\rho L}{S} \tag{III}$$

It can be seen from the formula (III) that when S becomes larger, the heating power P decreases. Therefore, the larger the cross-sectional area of the blade, the smaller the resistance of the heater and the smaller the heating power of the heater. In this way, a heating area of the side-main heater 10 is small and then the heating is uneven. When the temperature field is kept constant, the power consumption will increase, which is not conducive to cost saving and control of oxygen content of a crystal ingot during the crystal pulling process, thereby affecting the overall quality of the crystal ingot.

Figure 5:
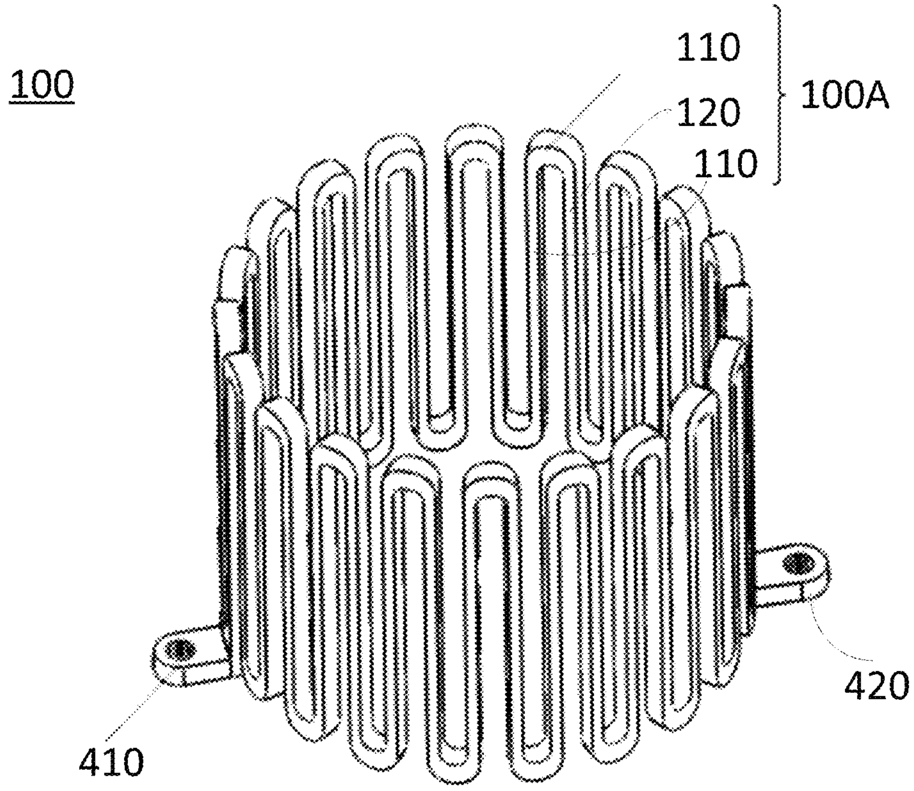
FIG. 5 is a schematic diagram of a heater body of a side-main heater in a heater in a Hot-Zone of a single crystal pulling apparatus according to an embodiment of the present disclosure.
Figure 6:
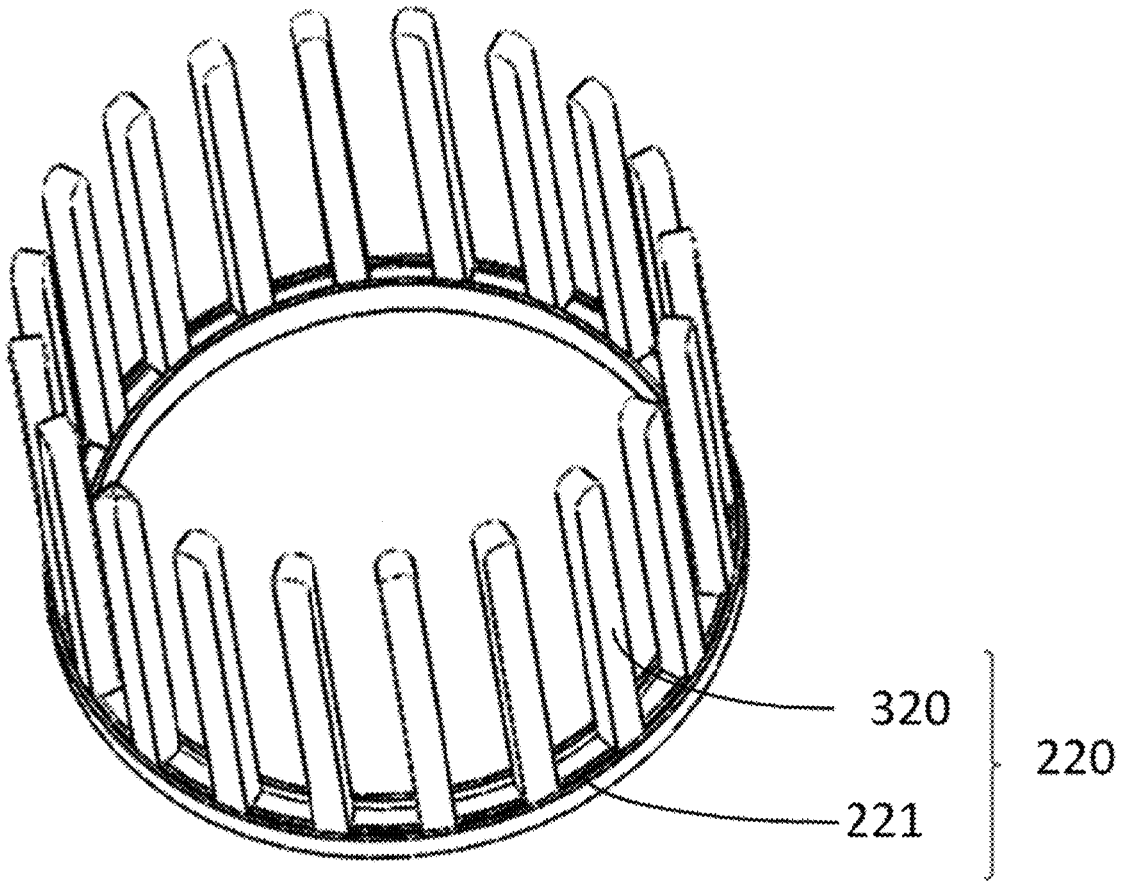
FIG. 6 is a schematic diagram of a second cover body in a heater in a Hot-Zone of a single crystal pulling apparatus according to an embodiment of the present disclosure.
Figure 7:
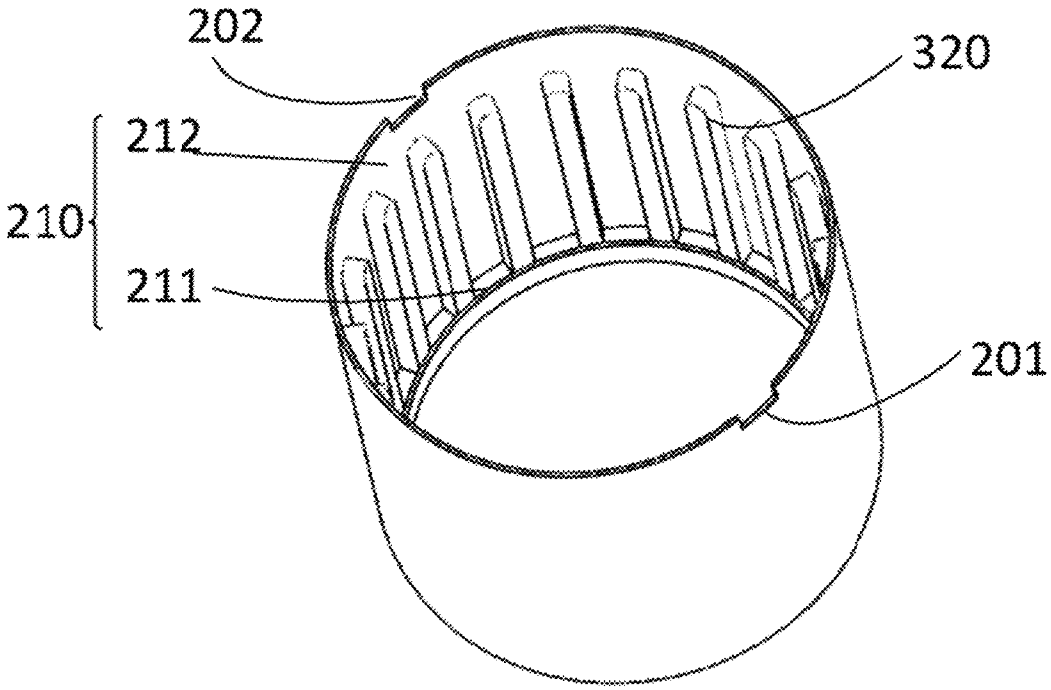
FIG. 7 is a schematic diagram of a first cover body in a heater in a Hot-Zone of a single crystal pulling apparatus according to an embodiment of the present disclosure.

In one embodiment of the present disclosure, as shown in FIG. 4 and FIG. 5, the heater body 100 includes a plurality of U-shaped heating column units 100A. The plurality of U-shaped heating column units 100A are connected in sequence to form the first cylindrical structure. Among two adjacent U-shaped heating column units 100A, an opening of one U-shaped heating column unit 100A is oriented towards the top open end of the heater body 100, and an opening of the other U-shaped heating column unit 100A is oriented towards the bottom open end of the heater body 100, so that an outline of the heater body 100 is a serpentine curve structure.

Optionally, each of the U-shaped heating column units includes:

two vertical straight heating columns 110 which are parallel to each other, where an extension direction of the vertical straight heating columns 110 is parallel to an axial direction of the first cylindrical structure; and, an arc-shaped or linear transverse heating column connected between the two vertical straight heating columns 110. There is a gap A, in a circumferential direction of the first cylindrical structure, between the two vertical straight heating columns 110. A width of the gap A in the circumferential direction of the first cylindrical structure is smaller than or equal to a width of the vertical straight heating column 110 in the circumferential direction of the first cylindrical structure.

In the above solution, the structure of the heater body 100 is improved in such a manner that the heater body 100 is designed as a first cylindrical structure formed by a plurality of U-shaped heating column units 100A connected end to end, and the heating columns in each U-shaped heating column unit 100A include two vertical straight heating columns 110 and one arc-shaped or linear transverse heating column 120. The heating column of such structure has a cross-sectional size smaller than a cross-sectional size of the blade of the blade structure in the side-main heater 10 in the related art. Comparing the gap A between the two vertical straight heating columns 110 with the slit between the blades in the side-main heater 10 in the related art, a size of the gap A is larger than the size of the slit. In this way, due to reduction of the cross-sectional area of the heating column, the resistance of the heater is increased and then the heating power of the heater is increased. As a result, the design of the annular U-shaped heating column units 100A ensures that the heating of the heater is more uniform, and the heating area of the side-main heater 10 is large, thereby reducing power consumption in case of keeping the temperature field constant, which is conducive to cost saving and control of oxygen content of a crystal ingot during the crystal pulling process, thereby improving the overall quality of the crystal ingot.

In addition, it should be noted that, in some embodiments of the present disclosure, the heating power may be further increased by increasing a length of a single vertical straight heating column 110.

In some embodiments, a width of the vertical straight heating column 110 in the circumferential direction of the first cylindrical structure is 15-20 mm, and a cross-sectional area of the vertical straight heating column is less than or equal to a cross-sectional area of the gap between two adjacent vertical straight heating columns. Further, the cross-sectional area of the vertical straight heating column is 150-200 $mm^2$; and a length of the vertical straight heating column 110 from the top open end to the bottom open end of the first cylindrical structure is 320~350 mm. It should be noted that, in practical applications, the specific structure of the side-main heater 10 may not be limited to this.

In addition, in the embodiments provided in the present disclosure, as shown in FIG. 4 to FIG. 7, a plurality of second supporters 300 for supporting the heater body 100 is provided on the inner side wall of the insulating protective cover 200. At least one of the second supporters 300 is disposed in the gap A between the two vertical straight heating columns of each U-shaped heating column unit 100A.

With the above solution, since the heater body 100 adopts the U-shaped heating column units 100A, the gap A between the adjacent vertical straight heating columns 110 is large and its mechanical properties may be weakened. In order to improve impact resistance of the heater body 100 to improve its comprehensive mechanical properties, in the above solution, by providing the second supporters 300 on the insulating protective cover 200, at least one of the second supporters 300 is disposed in the gap A between the two vertical straight heating columns 110 of each U-shaped heating column unit 100A, thereby supporting and protecting the heater body 100, so that the heater in the Hot-Zone of the single crystal pulling apparatus has a better impact resistance and improved comprehensive mechanical performance.

In some embodiments provided in the present disclosure, as shown in FIG. 4 to FIG. 7, the plurality of second supporters 300 include a plurality of first support columns 310 and a plurality of second support columns 320 arranged alternately. The first support column 310 is arranged in the gap A between the two vertical straight heating columns 110 of the U-shaped heating column unit 100A whose opening is oriented towards the top open end of the heater body. The second support column 320 is arranged in the gap A between the two vertical straight heating columns 110 of the U-shaped heating column unit 100A whose opening is oriented towards the bottom open end of the heater body.

In the above embodiment, the second supporter 300 is a columnar structure, i.e., a support column, disposed in the gap A between the two vertical straight heating columns 110 of the U-shaped heating column unit 100A. In other embodiments, the second supporter 300 is not limited to a support column, and may adopt other structures, such as a support block.

In addition, in some embodiments of the present disclosure, as shown in FIG. 4 to FIG. 7, the insulating protective cover 200 includes a first cover body 210 and a second cover body 220. The first cover body 210 includes: an annular top shielding plate 211, where the top shielding plate 211 shields the top open end of the heater body 100; and, a side shielding plate 212, where the side shielding plate 212 surrounds the outer peripheral side of the heater body 100 and fixedly connected with the top shielding plate 211. The plurality of first support columns 310 are evenly distributed along a circumferential direction of the top shielding plate 211, and are fixed on an inner side wall of the side shielding plate 212. The second cover body 220 includes: an annular bottom shielding plate 221, where the bottom shielding plate 221 shields the bottom open end of the heater body 100. The plurality of second support columns 320 are evenly distributed along a circumferential direction of the bottom shielding plate 221. The plurality of second support columns 320 are fixed on the bottom shielding plate 221. The plurality of second support columns 320 are inserted into the side shielding plate 212 to fasten the first cover body 210 to the second cover body 220.

In the above embodiment, the insulating protective cover 200 is composed of upper and lower cover bodies, namely, the first cover body 210 and the second cover body 220. Such structure is convenient for fastening the cover bodies to the heater body 100. Further, the first support columns 310 and the second support columns 320 are respectively provided on the two cover bodies, serve as the framework of the heater body 100, and play a role of supporting and protecting the heater body 100.

In other embodiments of the present disclosure, the insulating protective cover 200 includes a first cover body 210 and a second cover body 220. The first cover body 210 includes: an annular bottom shielding plate 221, where the bottom shielding plate 221 shields the bottom open end of the heater body 100; and, a side shielding plate 212, where the side shielding plate 212 surrounds the outer peripheral side of the heater body 100 and fixedly connected with the bottom shielding plate 221. The plurality of second support columns 320 are evenly distributed along a circumferential direction of the bottom shielding plate 221, and are fixed on an inner side wall of the side shielding plate 212. The second cover body 220 includes: an annular top shielding plate 211, where the top shielding plate 211 shields the top open end of the heater body 100. The plurality of first support columns 310 are evenly distributed along a circumferential direction of the top shielding plate 211. The plurality of first support columns 310 are fixed on the top shielding plate 211. The plurality of first support columns 310 are inserted into the side shielding plate 212 to fasten the first cover body 210 to the second cover body 220.

It should be noted that the above is only an exemplary embodiment of the insulating protective cover 200, and in practical applications, the specific structure of the insulating protective cover 200 is not limited.

In addition, it should be noted that, the insulating protective cover 200 may be made of high-temperature-resistant and corrosion-resistant insulating materials, for example, semiconductor ceramic materials.

In addition, the length of the vertical straight heating column from the top open end to the bottom open end of the first cylindrical structure is equal to a length of the first support column on the first cover or a length of the second support column on the second cover.

In addition, as shown in FIG. 4 to FIG. 7, in one embodiment of the present disclosure, the heater body 100 is further connected with at least a first electrode connector 410 and a second electrode connector 420. The first electrode connector 410 and the second electrode connector 420 are located at opposite sides of the heater body 100, respectively. The insulating protective cover 200 is provided with at least a first opening 201 and a second opening 202. The first electrode connector 410 extends through the first opening 201, and the second electrode connector 420 extends through the second opening 202.

In the above embodiment, the first electrode connector 410 and the second electrode connector 420 are respectively provided on the heater body 100 for connecting with electrodes of the heater body 100.

It should be noted that, in some embodiments, the heater body 100 is provided with at least two electrode connectors, but in practical applications, the number of electrode connectors on the heater body 100 is not limited to two. For example, there may be three electrode connectors, that is, the connectors on the heater body 100 may be a three-phase electrical connector.

In addition, one embodiment of the present disclosure further provides a single crystal pulling apparatus, which includes the heater in the Hot-Zone of the single crystal pulling apparatus provided in the embodiment of the present disclosure. Obviously, the single crystal pulling apparatus provided in the embodiment of the present disclosure can also bring about the beneficial effects brought by the heater in the Hot-Zone of the single crystal pulling apparatus provided in the embodiment of the present disclosure, which is not repeated here.

The following points need to be noted:

(1) The drawings of the embodiments of the present disclosure only relate to structures related to the embodiments of the present disclosure, and other structures may refer to general designs.

(2) In the drawings used to describe embodiments of the present disclosure, thickness of layers or regions may be enlarged or reduced for clarity, i.e., the drawings are not drawn to actual scale. It will be understood that when an element such as a layer, film, region or substrate is referred to as being "on" or "under" another element, the element may be "directly" "on" or "under" the other element, or intermediate elements may be present.

(3) Where not conflicting, the embodiments of the present disclosure and features within the embodiments may be combined with each other to obtain new embodiments.

The above are only specific embodiments of the present disclosure, but the protection scope of the present disclosure is not limited thereto, and the protection scope of the present disclosure should be subject to the protection scope of the claims.

What is claimed is:

1. A heater in a Hot-Zone of a single crystal pulling apparatus, comprising:

a side-main heater; and an auxiliary heater;

wherein each of the side-main heater and the auxiliary heater comprises a cylindrical structure with openings at two ends thereof, each of the side-main heater and the auxiliary heater includes a top open end and a bottom open end, the auxiliary heater is sleeved around the side-main heater, and the top open end of the auxiliary heater extends out of the top open end of the side-main heater; the side-main heater includes a heater body located between the top open end of the side-main heater and the bottom open end of the side-main heater;

wherein the auxiliary heater includes:

a protective casing surrounding the side-main heater; and an electromagnetic induction coil accommodated in the protective casing;

wherein the protective casing includes an inner casing and an outer casing that are fastened to each other; and wherein, each of the inner casing and the outer casing is cylindrical;

the inner casing covers and surrounds an entire outer peripheral side of the heater body of the side-main heater;

the outer casing is sleeved around the inner casing with a chamber defined between the outer casing and the inner casing;

the inner casing includes a first inner side wall that cooperates with the outer casing to define the chamber;

the electromagnetic induction coil is accommodated in the chamber;

the electromagnetic induction coil is spirally wound around the first inner side wall from a top open end of the inner casing to a bottom open end of the inner casing; and two ends of the electromagnetic induction coil extend out of the protective casing, respectively.

2. The heater in the Hot-Zone of the single crystal pulling apparatus according to claim 1, further comprising:

a stepped first edge at the top open end of the inner casing;

a stepped second edge at an edge of a top open end of the outer casing wherein stepped structures of the first edge and the second edge overlap each other;

a stepped third edge at an edge of the bottom open end of the inner casing and a stepped fourth edge at an edge of a bottom open end of the outer casing, wherein stepped structures of the third edge and the fourth edge overlap each other.

3. The heater in the Hot-Zone of the single crystal pulling apparatus according to claim 1, wherein:

the electromagnetic induction coil includes a plurality of spiral rings;

a plurality of first supporters is provided on the first inner side wall of the inner casing, and one of the plurality of first supporters is arranged between two adjacent spiral rings.

4. The heater in the Hot-Zone of the single crystal pulling apparatus according to claim 1, wherein the heater body is a first cylindrical structure, and the side-main heater further includes:

an insulating protective cover, wherein the insulating protective cover is a cylindrical cover, the insulating protective cover at least covering a top open end of the heater body, a bottom open end of the heater body, and the outer peripheral side between the top open end and the bottom open end of the heater body.

5. The heater in the Hot-Zone of the single crystal pulling apparatus according to claim 4, wherein the heater body includes a plurality of U-shaped heating column connected in sequence to form the first cylindrical structure;

and wherein among two adjacent U-shaped heating column units, an opening of a first of the adjacent U-shaped heating column units is oriented towards a top open end of the first cylindrical structure, and an opening of a second of the adjacent U-shaped heating column units is oriented towards a bottom open end of the first cylindrical structure, thereby enabling an outline of the heater body to be a serpentine curve structure.

6. The heater in the Hot-Zone of the single crystal pulling apparatus according to claim 5, wherein each of the plurality of U-shaped heating column units includes:

two vertical straight heating columns which are parallel to each other, wherein an extension direction of the vertical straight heating columns is parallel to an axial direction of the first cylindrical structure; and, an arc-shaped or linear transverse heating column connected between the two vertical straight heating columns;

a gap, in a circumferential direction of the first cylindrical structure, between the two vertical straight heating columns, a width of the gap in the circumferential direction of the first cylindrical structure is greater than or equal to a width of the vertical straight heating column in the circumferential direction of the first cylindrical structure.

7. The heater in the Hot-Zone of the single crystal pulling apparatus according to claim 6, wherein:

the width of the vertical straight heating column in the circumferential direction of the first cylindrical structure is 15-20 mm;

a cross-sectional area of the vertical straight heating column is 150-200 $mm^2$; and a length of the vertical straight heating column from the top open end to the bottom open end of the first cylindrical structure is 320~350 mm.

8. The heater in the Hot-Zone of the single crystal pulling apparatus according to claim 5, further comprising a plurality of second supporters for supporting the heater body disposed on an inner side wall of the insulating protective cover, wherein at least one of the plurality of second supporters is disposed in the gap between the two vertical straight heating columns of each of the plurality of U-shaped heating column units.

9. The heater in the Hot-Zone of the single crystal pulling apparatus according to claim 8, wherein the plurality of second supporters include a plurality of first support columns and a plurality of second support columns arranged alternately, each first support column arranged in a gap between two vertical straight heating columns of the U-shaped heating column unit having an opening oriented towards the top open end of the heater body, and each second support column arranged in a gap between two vertical straight heating columns of the U-shaped heating column unit having a opening oriented towards the bottom open end of the heater body.

10. The heater in the Hot-Zone of the single crystal pulling apparatus according to claim 9, wherein the insulating protective cover includes a first cover body and a second cover body, wherein:

the first cover body includes an annular top shielding plate and a side shielding plate, wherein the top shielding plate shields the top open end of the heater body, and, the side shielding plate surrounds the outer peripheral side of the heater body and fixedly connected with the top shielding plate, and wherein the plurality of first support columns are evenly distributed along a circumferential direction of the top shielding plate, and are fixed on an inner side wall of the side shielding plate;

the second cover body includes an annular bottom shielding plate, wherein the bottom shielding plate shields the bottom open end of the heater body, the plurality of second support columns are evenly distributed along a circumferential direction of the bottom shielding plate, and the plurality of second support columns are fixed on the bottom shielding plate; and the plurality of second support columns are inserted into the side shielding plate to fasten the first cover body to the second cover body.

11. The heater in the Hot-Zone of the single crystal pulling apparatus according to claim 9, wherein the insulating protective cover includes a first cover body and a second cover body wherein:

the first cover body includes an annular bottom shielding plate and a side shielding plate, wherein the bottom shielding plate shields the bottom open end of the heater body, and the side shielding plate surrounds the outer peripheral side of the heater body and fixedly connected with the bottom shielding plate, and wherein the plurality of second support columns are evenly distributed along a circumferential direction of the bottom shielding plate, and are fixed on an inner side wall of the side shielding plate;

the second cover body includes an annular top shielding plate, wherein the top shielding plate shields the top open end of the heater body, the plurality of first support columns are evenly distributed along a circumferential direction of the top shielding plate, and the plurality of first support columns are fixed on the top shielding plate;

wherein the plurality of first support columns are inserted into the side shielding plate to fasten the first cover body to the second cover body.

12. The heater in the Hot-Zone of the single crystal pulling apparatus according to claim 4, wherein:

the heater body is further connected with at least a first electrode connector and a second electrode connector;

the first electrode connector and the second electrode connector are located at opposite sides of the heater body, respectively;

the insulating protective cover is provided with at least a first opening and a second opening; and the first electrode connector extends through the first opening, and the second electrode connector extends through the second opening.

13. A single crystal pulling apparatus, comprising:

a heater in a Hot-Zone of the single crystal pulling apparatus, the heater in the Hot-Zone of the single crystal pulling apparatus including a side-main heater and an auxiliary heater, each of the side-main heater and the auxiliary heater being a cylindrical structure with openings at two ends thereof, each of the side-main heater and the auxiliary heater including a top open end and a bottom open end, wherein the auxiliary heater is sleeved around the side-main heater, and the top open end of the auxiliary heater extends out of the top open end of the side-main heater; the side-main heater includes a heater body located between the top open end of the side-main heater and the bottom open end of the side-main heater;

wherein the auxiliary heater includes:

a protective casing surrounding the side-main heater; and an electromagnetic induction coil accommodated in the protective casing;

wherein the protective casing includes an inner casing and an outer casing that are fastened to each other; and wherein, each of the inner casing and the outer casing is cylindrical;

the inner casing covers and surrounds an entire outer peripheral side of the heater body of the side-main heater;

the outer casing is sleeved around the inner casing with a chamber defined between the outer casing and the inner casing;

the inner casing includes a first inner side wall that cooperates with the outer casing to define the chamber;

the electromagnetic induction coil is accommodated in the chamber;

the electromagnetic induction coil is spirally wound around the first inner side wall from a top open end of the inner casing to a bottom open end of the inner casing; and two ends of the electromagnetic induction coil extend out of the protective casing, respectively.

14. The single crystal pulling apparatus according to claim 13, further comprising:

a stepped first edge at the top open end of the inner casing;

a stepped second edge at an edge of a top open end of the outer casing wherein stepped structures of the first edge and the second edge overlap each other;

a stepped third edge at an edge of the bottom open end of the inner casing and a stepped fourth edge at an edge of a bottom open end of the outer casing, wherein stepped structures of the third edge and the fourth edge overlap each other.

15. The single crystal pulling apparatus according to claim 13, wherein:

the electromagnetic induction coil includes a plurality of spiral rings; and a plurality of first supporters is provided on the first inner side wall of the inner casing, and one of the plurality of first supporters is arranged between two adjacent spiral rings.

16. The single crystal pulling apparatus according to claim 13, wherein the heater body is a first cylindrical structure, and the side-main heater further includes:

an insulating protective cover, wherein the insulating protective cover is a cylindrical cover, the insulating protective cover at least covering a top open end of the heater body, a bottom open end of the heater body, and the outer peripheral side between the top open end and the bottom open end of the heater body.

* * * * *